United States Patent
Roberts

(10) Patent No.: US 6,271,073 B1
(45) Date of Patent: Aug. 7, 2001

(54) METHOD OF FORMING TRANSISTORS IN A PERIPHERAL CIRCUIT OF A SEMICONDUCTOR MEMORY DEVICE

(75) Inventor: Ceredig Roberts, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/456,140

(22) Filed: Dec. 7, 1999

Related U.S. Application Data

(62) Division of application No. 08/786,175, filed on Jan. 21, 1997, now Pat. No. 6,040,209, which is a continuation of application No. 08/376,103, filed on Jan. 19, 1995, now abandoned.

(51) Int. Cl.[7] ............................................. H01L 21/8242
(52) U.S. Cl. ........................................... 438/238; 438/253
(58) Field of Search ................... 438/238–256, 438/381–399; 257/300–306

(56) References Cited

U.S. PATENT DOCUMENTS

| | | | |
|---|---|---|---|
| 4,370,798 | 2/1983 | Lien et al. | 437/918 |
| 4,408,385 | 10/1983 | Mohan Rao | 437/918 |
| 4,426,764 | 1/1984 | Kosa et al. | 29/571 |
| 4,977,099 | 12/1990 | Kotaki | 432/52 |
| 5,013,678 | 5/1991 | Winnerl | 437/52 |
| 5,135,881 | 8/1992 | Saeki | 437/52 |
| 5,245,205 | * 9/1993 | Higasitani et al. | 257/296 |
| 5,281,838 | 1/1994 | Okumura et al. | 257/306 |
| 5,293,336 | 3/1994 | Ishii et al. | 365/149 |
| 5,327,002 | 7/1994 | Motoyoshi | 257/380 |
| 5,352,620 | * 10/1994 | Komori et al. . | |
| 5,356,826 | 10/1994 | Natsume | 437/60 |
| 5,489,791 | 2/1996 | Arima et al. | 257/336 |
| 5,497,018 | * 3/1996 | Kajita | 257/316 |
| 5,500,387 | 3/1996 | Tung et al. | 437/60 |
| 5,808,335 | 9/1998 | Sung | 257/306 |
| 5,828,096 | 10/1998 | Ohno et al. | 257/306 |

FOREIGN PATENT DOCUMENTS

| | | | |
|---|---|---|---|
| 0522689A2 | 1/1993 | (EP) | H01L/27/11 |
| 0522689A3 | 1/1993 | (EP) | H01L/27/11 |
| 3259566 | 11/1991 | (JP) | H01L/27/108 |
| 4186877 | 7/1992 | (JP) | H01L/27/115 |
| 4322459 | 11/1992 | (JP) | H01L/27/108 |
| 5021805 | 1/1993 | (JP) | H01L/27/788 |
| 5121700 | 5/1993 | (JP) | H01L/27/115 |

* cited by examiner

Primary Examiner—Jey Tsai
(74) Attorney, Agent, or Firm—Ormiston & McKinney, PLLC

(57) ABSTRACT

A method of forming a transistor in a peripheral circuit of a random access memory device wherein a transistor gate, capacitor electrode or other component in the memory cell array is formed simultaneously with the formation of a transistor gate in the periphery.

1 Claim, 11 Drawing Sheets

METHOD OF FORMING TRANSISTORS IN A PERIPHERAL CIRCUIT OF A SEMICONDUCTOR MEMORY DEVICE

CROSS REFERENCE TO RELATED APPLICATIONS

This application is a division of application Ser. No. 08/786,175 filed Jan. 21, 1997, U.S. Pat. No. 6,040,209, which is a continuation of application Ser. No. 08/376,103 filed Jan. 19, 1995 abn.

FIELD OF THE INVENTION

The invention relates generally to the fabrication of semiconductor memory devices and, more specifically, to a method of forming transistors in a peripheral circuit of a random access memory device.

BACKGROUND OF THE INVENTION

Generally, integrated circuits are mass produced by forming many identical circuit patterns on a single silicon wafer. Integrated circuits, also commonly referred to as semiconductor devices, are made of various materials that may be electrically conductive, electrically nonconductive (insulators) or electrically semiconductive. It is advantageous to reduce the number of steps in the fabrication process to reduce fabrication costs and increase quality and reliability, since the opportunities for the occurrence of disabling defects is reduced. In this way, electronic equipment becomes more reliable, assembly and packaging costs are minimized and circuit performance is improved.

Random access memory devices such as Dynamic Random Access Memories (DRAMs) and Static Random Access Memories (SRAMs) include memory cells for storing data and peripheral circuits for switching signals in and out of the memory cells. It is desirable to form the transistors in the peripheral circuits at the same time transistors, capacitors and other components are formed in the memory cell array to minimize the number of processing steps necessary for fabrication of the entire device. During formation of the memory cells, layers of polysilicon and oxide insulators are deposited, patterned and etched to form the memory cell components. At the same time, these polysilicon and oxide layers are also being deposited and, to some extent, further processed in the area of the chip where the peripheral circuit transistors are formed. The efficiency of the overall process flow is enhanced to the extent the formation of transistors in the peripheral circuit can be integrated into the formation of memory cell components.

SUMMARY OF THE INVENTION

The general purpose and principal object of the present invention is to provide a method that integrates the formation of transistors in the peripheral circuit with the formation of resistors, capacitors and other components in the memory cell array of semiconductor memory devices.

To accomplish the above and other objects, there has been developed a method of forming a transistor in a peripheral circuit of a random access memory device which includes the steps of forming over a substrate in a memory cell array region and in a peripheral region, a gate oxide layer and at least one polysilicon layer over the gate oxide layer, and then patterning and etching the polysilicon layer(s) to simultaneously form a resistor, capacitor electrode or other component in the array region and a periphery transistor gate in the peripheral region.

In one aspect of the invention, the periphery transistor gate is formed simultaneously with the formation of a load resistor in the memory cell array of a Static Random Access Memory (SRAM). In this aspect of the invention, the step of patterning and etching a polysilicon layer in the peripheral region is performed simultaneously with and as part of the patterning and etching of a polysilicon layer in the memory cell array region during which the formation of the load resistor is completed. Alternatively, the periphery gate may be formed simultaneously with the formation of the ground line and bitline contact landing pad in the SRAM memory cell array region. That is, the step of patterning and etching a polysilicon layer in the peripheral region is performed simultaneously with and as part of the patterning and etching of a polysilicon layer in the memory cell array region whereby the ground line and bitline contact landing pad is formed.

In another aspect of the invention, the periphery transistor gate is formed simultaneously with the formation of a capacitor electrode in the memory cell array region of a Dynamic Random Access Memory (DRAM). In this aspect of the invention, the step of patterning and etching a polysilicon layer in the peripheral region is performed simultaneously with and as part of the patterning and etching of a polysilicon layer in the memory cell array region during which a capacitor electrode is formed.

The foregoing and other objects, advantages and novel features of the invention will become apparent to those skilled in the art from the following detailed description wherein I have shown and described only the preferred embodiments of the invention simply by way of illustrating the best mode contemplated by me of carrying out the invention. The invention is capable of other and different embodiments and use in other applications, and its several details are capable of modifications in various obvious respects, all without departing from the scope and spirit of the invention. Accordingly, the drawings and descriptions are to be regarded as illustrative in nature and not as restrictive.

The drawings are not actual views of the portions of a semiconductor memory device depicted therein, but are schematic representations used to illustrate the invention.

DETAILED DESCRIPTION OF THE PREFERRED EMBODIMENTS

Complementary Metal Oxide Semiconductor (CMOS) technology is currently the most commonly used integrated circuit technology. CMOS generally refers to any integrated circuit in which both n-channel and p-channel Metal Oxide Semiconductor Field Effect Transistors (MOSFETs) are used in a complementary fashion. The invention will be described in terms of the formation of p-channel transistors in the periphery. Presently, both p-channel and n-channel periphery transistor gates are formed during formation of the n-channel transistor gates in the array. Consequently, the substrate contact regions adjacent to the p-channel transistor gates in the periphery must be masked during formation of the n-channel source/drain regions to prevent the introduction of n-type dopants into these regions. The present invention allows the periphery p-channel transistor gates to be formed after formation of the n-channel source/drain regions, thereby eliminating this masking step. The invention, however, may be used in other integrated circuit processes and structures.

The formation of integrated circuits includes photolithographic masking and etching. This process consists of creating a photolithographic mask containing the pattern of the component to be formed, coating the wafer with a light-sensitive material called photoresist, exposing the photoresist coated wafer to ultra-violet light through the mask to soften or harden parts of the photoresist (depending on whether positive or negative photoresist is used), removing the softened parts of the photoresist, etching to remove the materials left unprotected by the photoresist, and stripping the remaining photoresist. This photolithographic masking and etching process is referred to herein as "patterning and etching."

Figure 1:
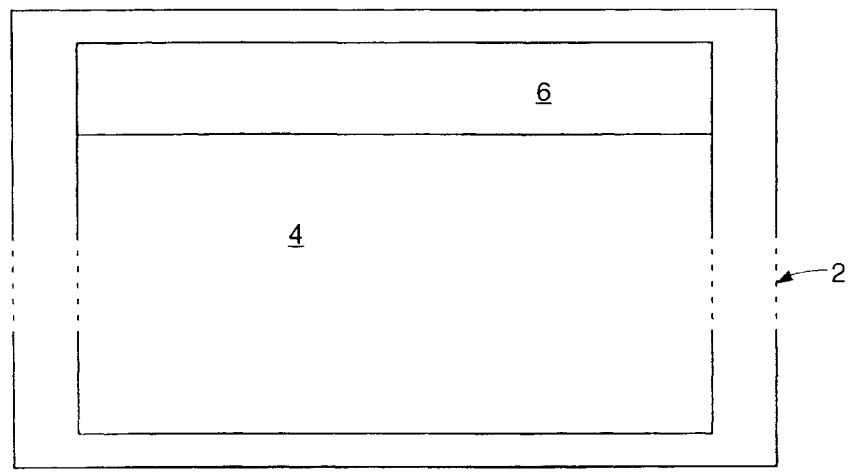
FIG. 1 is a plan view schematic showing the memory cell array and peripheral regions of a semiconductor memory device.

FIG. 1 is a plan view schematic showing a semiconductor memory device 2 comprising a memory cell array region 4 and a peripheral region 6. Memory device 2 is representative of a variety of memory devices to which the present invention may be applied, specifically including DRAMs and SRAMs. Methods of forming a p-channel transistor in a peripheral circuit of a DRAM and an SRAM according to the present invention are described in detail below with reference to FIGS. 2 and 3A–3F for an SRAM formed according to the preferred embodiment of the invention, FIGS. 4A–4F for an SRAM formed according to another embodiment of the invention, and FIGS. 5 and 6A–6F for a DRAM. Each of these schematic cross section views represents a number of process steps carried out to form the particular device structure shown. The techniques described for material deposition, patterning and etching, and ion implantation are conventional and well-known in the art.

Figure 2:
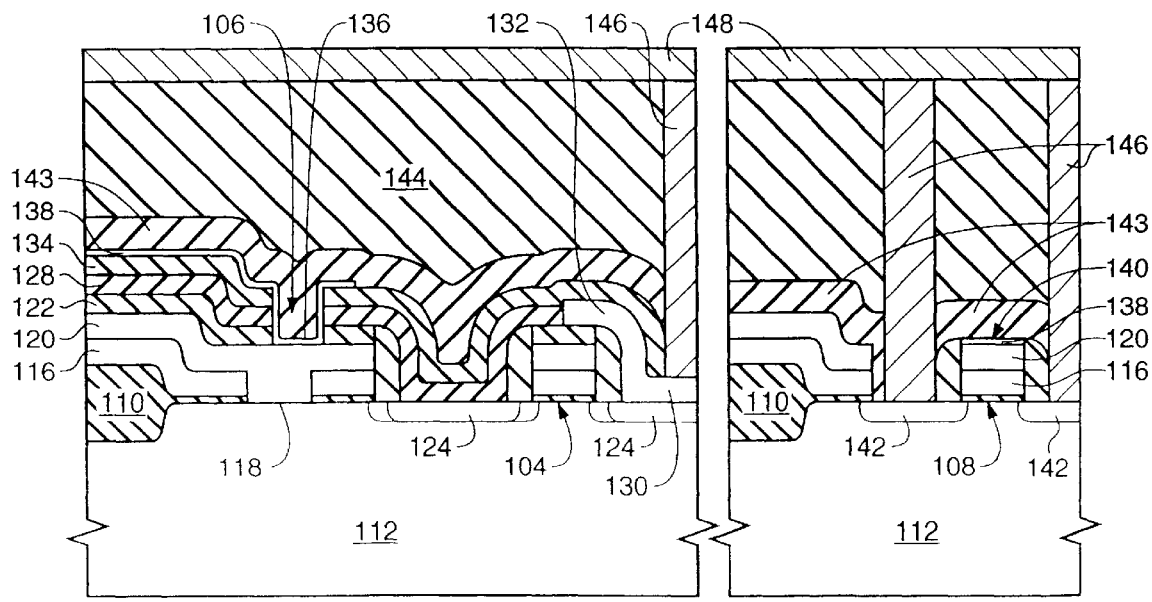
FIG. 2 is a cross section view of a portion of a Static Random Access Memory (SRAM) constructed according to the present invention.

Referring to FIG. 2, a portion of a four transistor SRAM memory cell is shown on the left side of FIG. 2, including transistor 104 and load resistor 106, and one periphery p-channel transistor 108 in a peripheral circuit is shown on the right side of FIG. 2. Transistor 104 illustrates either an access transistor or a pull down transistor in the memory cell array. For simplicity, transistor 104 is hereafter referred to as an access transistor. The process of fabricating the device illustrated in FIG. 2 will now be described with reference to FIGS. 3A–3F.

Figure 3A:
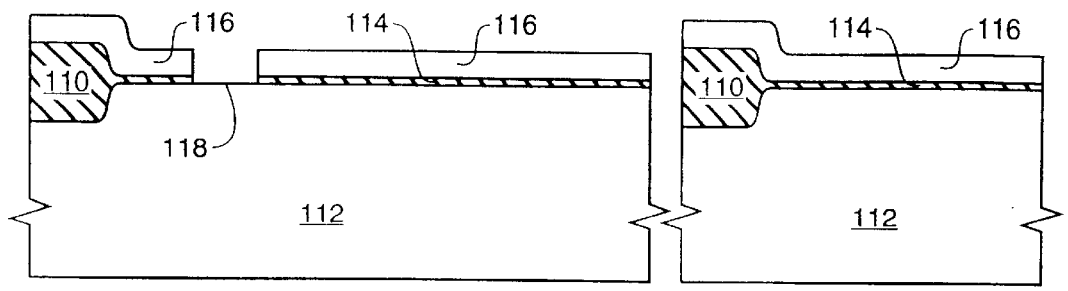
FIGS. 3A–3F are cross section views of the SRAM of FIG. 2 at various stages of formation illustrating the preferred embodiment of the invention.

Referring to FIG. 3A, p-type single crystal silicon substrate 112 has been oxidized to form gate oxide layer 114 and thick field oxide regions 110. Field oxide regions 110 provide electrical isolation between the memory cell array and the periphery as well as between individual memory cells within the array. In the preferred embodiment, an optional polysilicon layer 116 is formed by Chemical Vapor Deposition (CVD) over gate oxide layer 114. Polysilicon layer 116 is patterned and etched to expose portions of substrate 112 at desired locations of buried contact 118. The use of optional polysilicon layer 116 is preferred to better define the location of buried contact 118 and to reduce the depth of the subsequently formed exhumed contact area 136 (shown in FIGS. 2 and 3F).

Figure 3B:
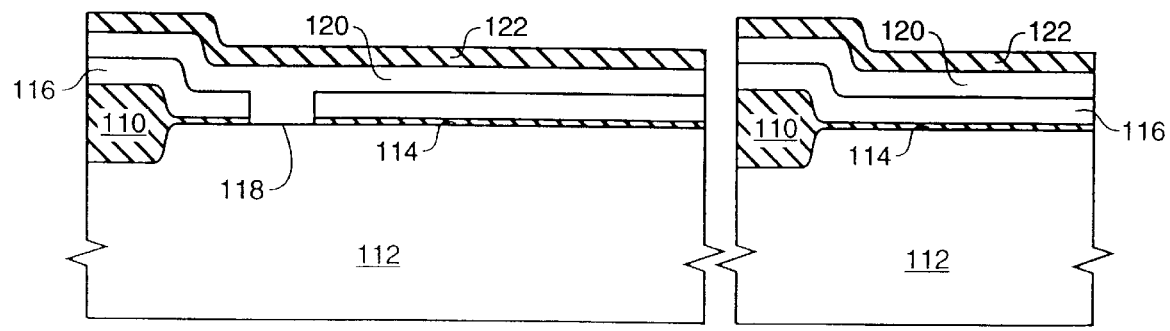
Figure 3C:
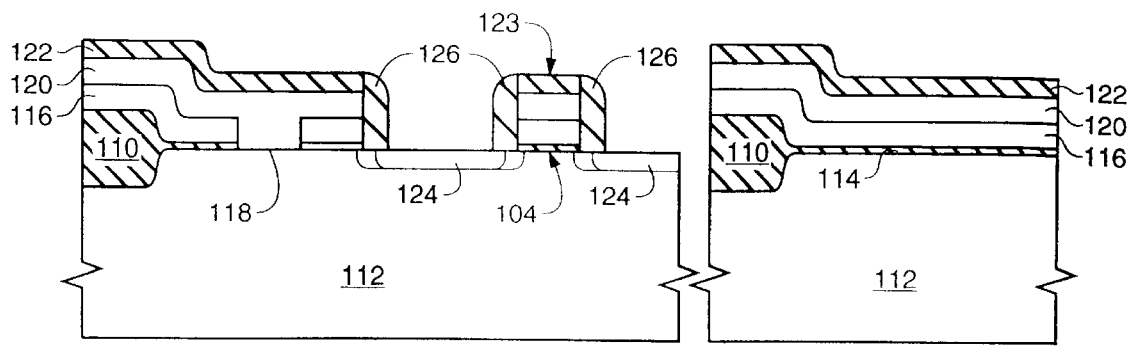

Referring to FIG. 3B, a first layer of polysilicon 120 is formed over optional polysilicon layer 116 and the exposed portions of substrate 112. First oxide layer 122 is formed over first polysilicon layer 120. Referring to FIG. 3C, first oxide layer 122 and polysilicon layers 120 and 116 are patterned and etched in the memory cell array to form access transistor gate 123 and to expose substrate 112 at locations of desired source and drain regions for access transistor 104. In the preferred embodiment shown in FIGS. 3A–3F, periphery p-channel transistor gate 140 is formed during the formation of load resistor 106 (see FIG. 3F) and the periphery is masked during the access transistor gate etch described above.

Lightly doped drain implants (LDDs) are formed by ion implanting n-type impurities in the exposed portions of substrate 112. Oxide spacers 126 are then formed on the sidewalls of the previously etched polysilicon and oxide layers as shown in FIG. 3C. The formation of source and drain regions 124 is completed by ion implanting impurities in the remaining exposed portions of substrate 112 at a dosage greater than the dosage used for the LDD implants referenced above.

Figure 3D:
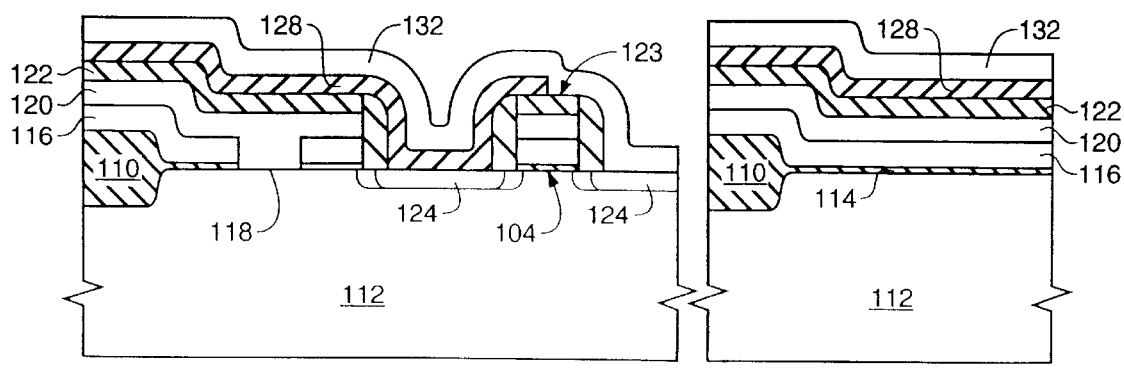
Figure 3E:
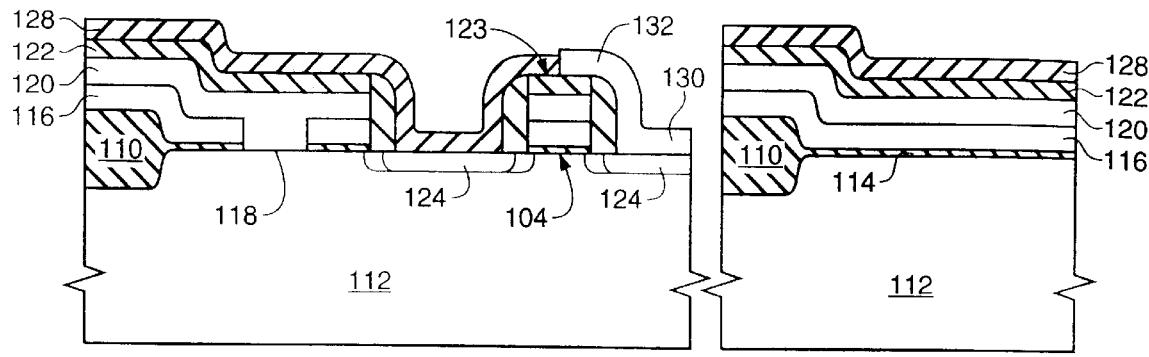

Referring to FIG. 3D, second oxide layer 128 is stacked over substrate 112. Second oxide layer 128 is patterned and etched to expose substrate 112 at the desired location of a ground line (not shown) and bitline contact landing pad 130 (shown in FIG. 3E) in the memory cell array. Optionally, second oxide layer 128 is removed from the periphery. A second layer of polysilicon 132 is stacked over substrate 112. Referring to FIG. 3E, second polysilicon layer 132 is patterned and etched to form a ground line (not shown) and bitline contact landing pad 130 in the memory cell array and to remove third polysilicon layer 138 from the periphery.

Figure 3F:
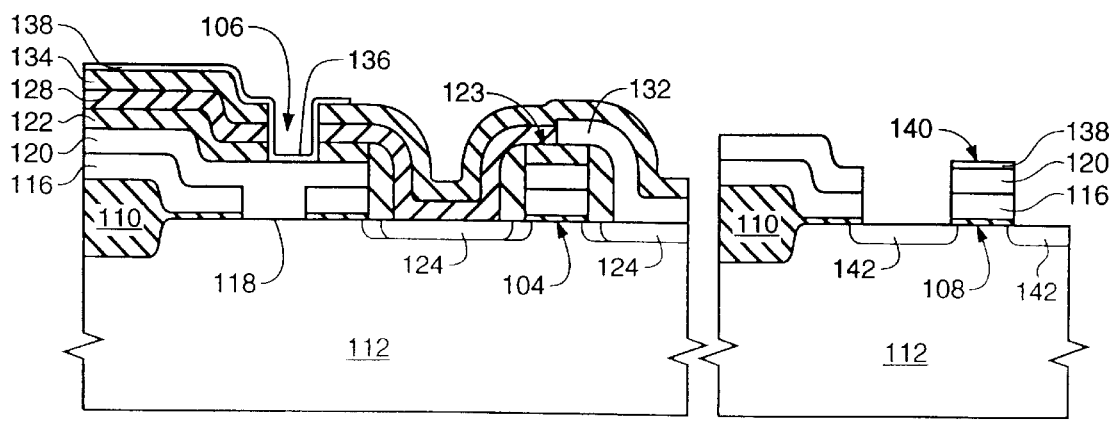

Referring to FIG. 3F, a third oxide layer 134 is stacked over substrate 112. Third, second and first oxide layers 134, 128 and 122 are patterned and etched to form exhumed contact area 136 in the array and to remove these layers from the periphery. A third layer of polysilicon 138 is then stacked over substrate 112. Third polysilicon layer 138 is patterned and etched in the array to complete formation of load resistor 106. In the preferred embodiment, this etch is used in the periphery to form periphery p-channel transistor gate 140 by allowing the etch to continue through polysilicon layers 120 and 116 to form periphery p-channel transistor gate 140. Third oxide layer 134 provides suitable protection for underlying components in the array during continued etching of the polysilicon layers in the periphery. Alternatively, the periphery may be separately patterned and etched to form periphery p-channel transistor gate 140. Source and drain regions 142 are then formed in the periphery by ion implanting p-type impurities in substrate 112 adjacent to periphery p-channel transistor gate 140, thus completing formation of periphery p-channel transistor 108. For SRAM structures in which the top layer of polysilicon forms the ground line and bitline contact landing pad (such as a six transistor SRAM having p-channel load transistors), the periphery p-channel transistor gate is formed during the same pattern and etch steps used to form the ground line and bitline contact landing pad.

Referring again to FIG. 2, thick oxide layer 143 and borophosphorous silicate glass (BPSG) layer 144 are then formed over the exposed upper surfaces of the structure previously formed. BPSG layer 144 and thick oxide layer 143 are patterned and etched to form an opening for metal posts 146. Metal posts 146 and bitline 148 are formed using metal deposition techniques well-known in the art.

Figure 4A:
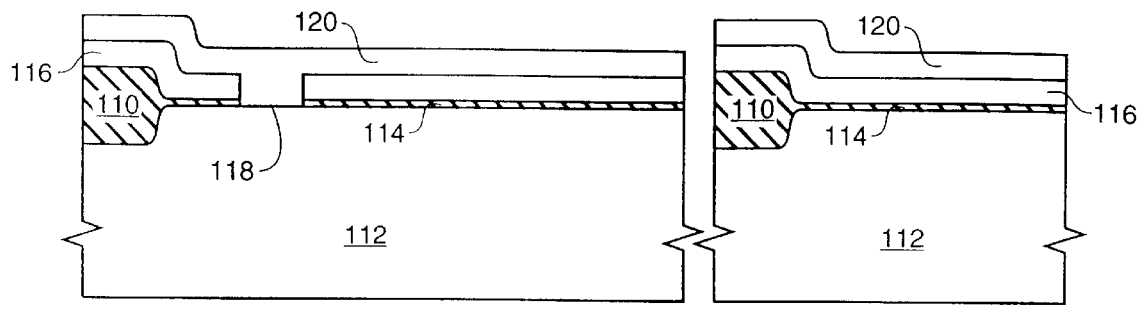
FIGS. 4A–4F are cross section views of an SRAM at various stages of formation illustrating another embodiment of the invention.

In another embodiment of the invention, illustrated in FIGS. 4A–4F, periphery p-channel transistor gate 140 is formed simultaneously with the formation of bitline landing pad 130. For convenience, the reference numerals used in FIGS. 4A–4F are the same as those used for the preferred embodiment of FIGS. 2 and 3A–3F. Referring to FIG. 4A, substrate 112 has been oxidized to form gate oxide layer 114 and thick field oxide regions 110. Optional polysilicon layer 116 is formed over gate oxide layer 114. Optional polysilicon layer 116 is patterned and etched to expose portions of substrate 112 at desired locations of buried contact 118. First polysilicon layer 120 is formed over optional polysilicon layer 116 and the exposed portions of substrate 112.

Figure 4B:
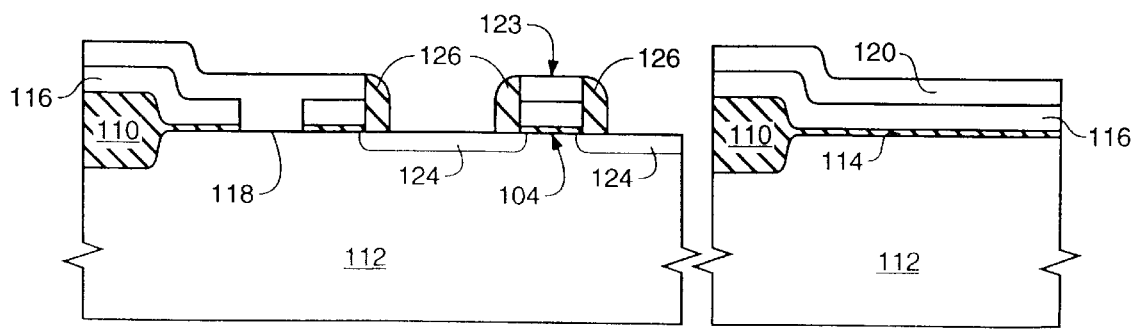

Referring to FIG. 4B, polysilicon layers 120 and 116 are patterned and etched in the memory cell array to form access transistor gate 123 and to expose substrate 112 at locations of desired source and drain regions for access transistor 104. Lightly doped drain implants (LDDs) are formed by ion implanting n-type impurities in the exposed portions of substrate 112. Oxide spacers 126 are then formed on the sidewalls of the previously etched polysilicon layers. The formation of source and drain regions 124 is completed by ion implanting impurities in the remaining exposed portions of substrate 112 at a dosage greater than the dosage used for the LDD implants.

Figure 4C:
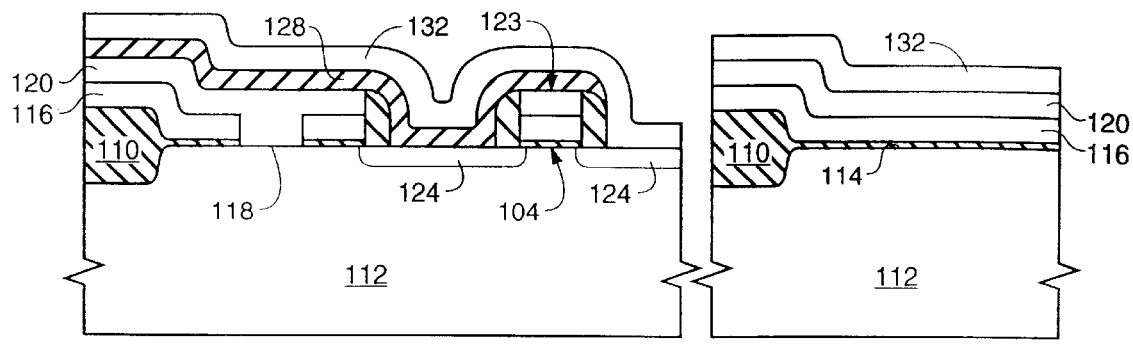
Figure 4D:
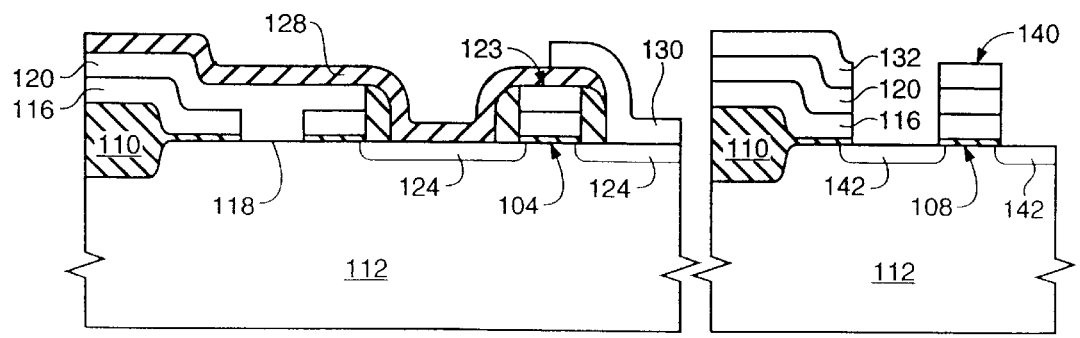

Referring to FIGS. 4C and 4D, oxide layer 128 is stacked over substrate 112. Oxide layer 128 is patterned and etched to expose substrate 112 at the desired location of a bitline contact landing pad 130 in the memory cell array and to remove oxide layer 128 from the periphery. Second polysilicon layer 132 is stacked over substrate 112 and patterned and etched to form bitline contact landing pad 130 in the memory cell array. Polysilicon layers 132, 120 and 116 are simultaneously etched in the periphery to form periphery p-channel gate 140.

Figure 4E:
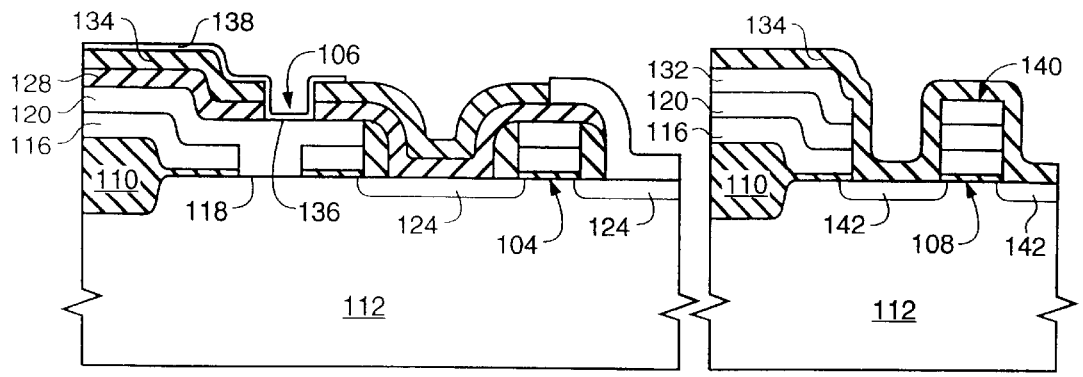

Referring to FIG. 4E, oxide layer 134 is stacked over substrate 112. Oxide layers 134 and 128 are patterned and etched to form exhumed contact area 136 in the array and to form oxide cap 139 in the periphery. A third layer of polysilicon 138 is then stacked over substrate 112. Third polysilicon layer 138 is patterned and etched in the array to complete formation of load resistor 106. Third polysilicon layer 138 is simultaneously removed from the periphery. Source and drain regions 142 are then formed in the periphery by ion implanting p-type impurities in substrate 112 adjacent to periphery p-channel transistor gate 140, thus completing formation of periphery p-channel transistor 108.

Figure 4F:
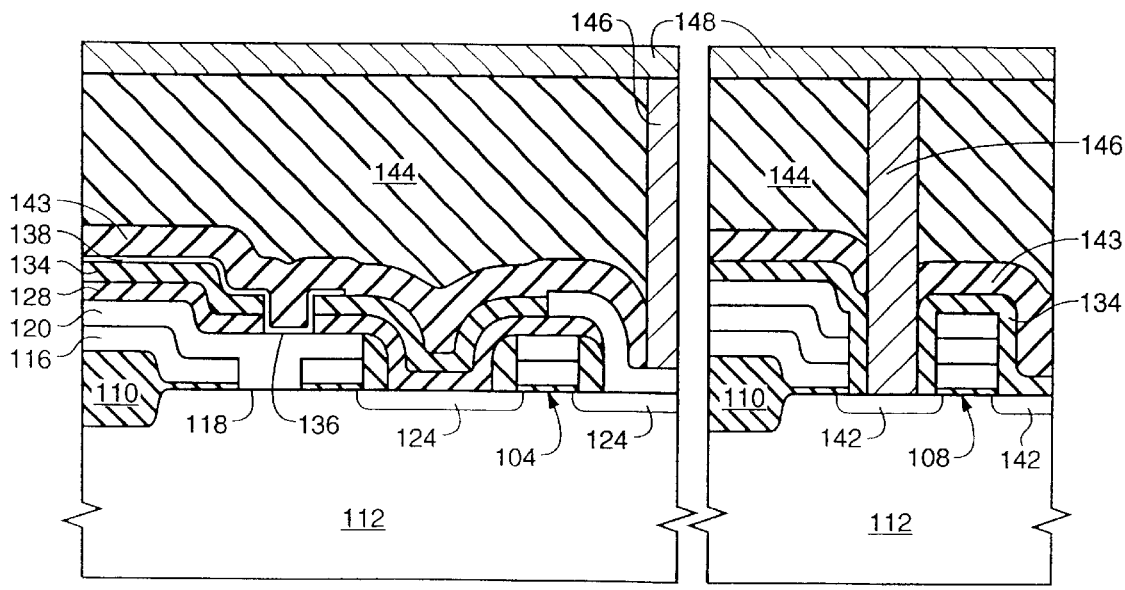

Formation of the device is then completed as described for the preferred embodiment and as illustrated in FIG. 4F.

Figure 5:
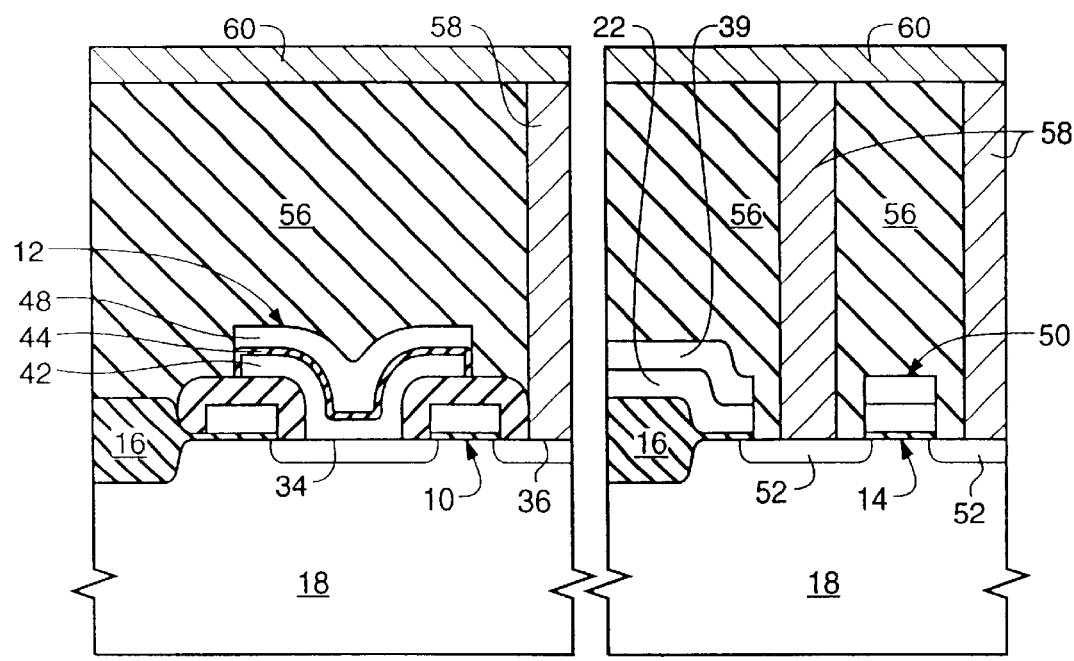
FIG. 5 is a cross section view of a portion of a Dynamic Random Access Memory (DRAM) constructed according to the present invention.

Referring now to FIG. 5, one memory cell comprising access transistor 10 and capacitor 12 in a DRAM memory cell array is shown on the left side and one periphery p-channel transistor 14 in a peripheral circuit is shown on the right side. The process of forming the device illustrated in FIG. 4 will now be described with reference to FIGS. 6A–6E.

Figure 6A:
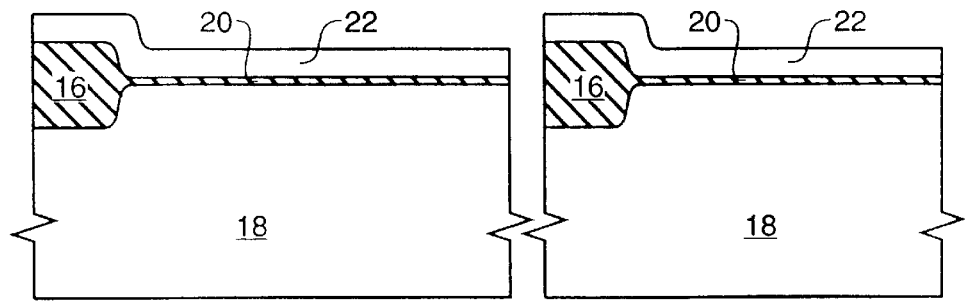
FIGS. 6A–6F are cross section views of the DRAM of FIG. 4 at various stages of formation illustrating another embodiment of the invention.

Referring to FIG. 6A, p-type single crystal silicon substrate 18 has been oxidized to form gate oxide layer 20 and thick field oxide regions 16. Field oxide regions 16 provide electrical isolation between the memory cell array and the periphery as well as between individual memory cells within the array. First polysilicon layer 22 is formed by Chemical Vapor Deposition (CVD) over gate oxide layer 20.

Figure 6B:
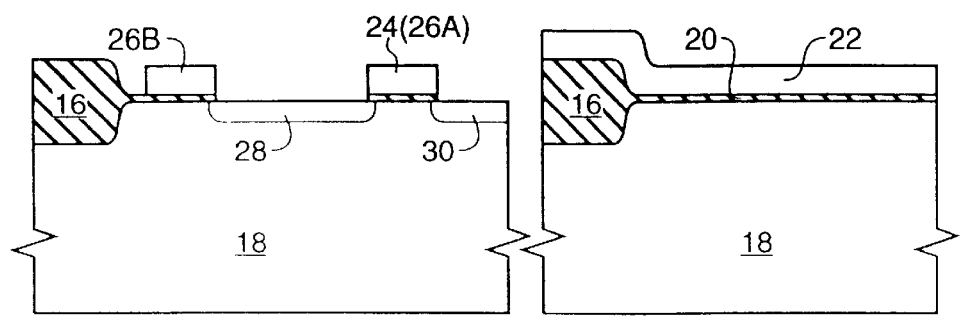
Figure 6C:
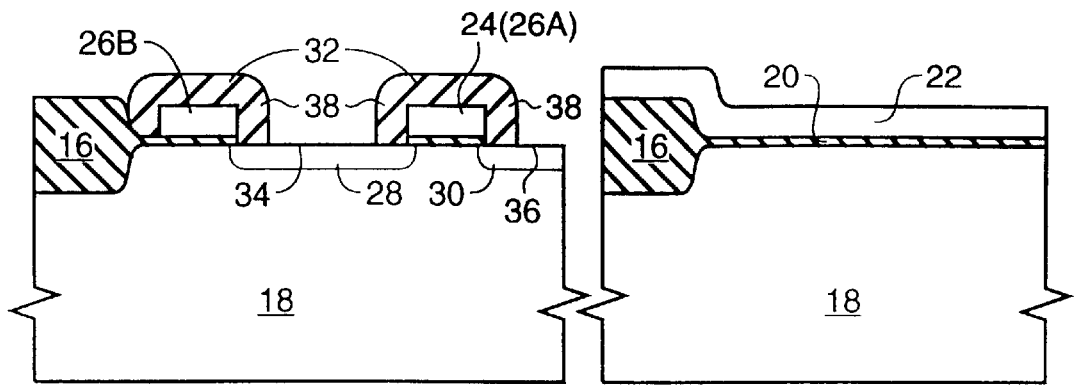
Figure 6D:
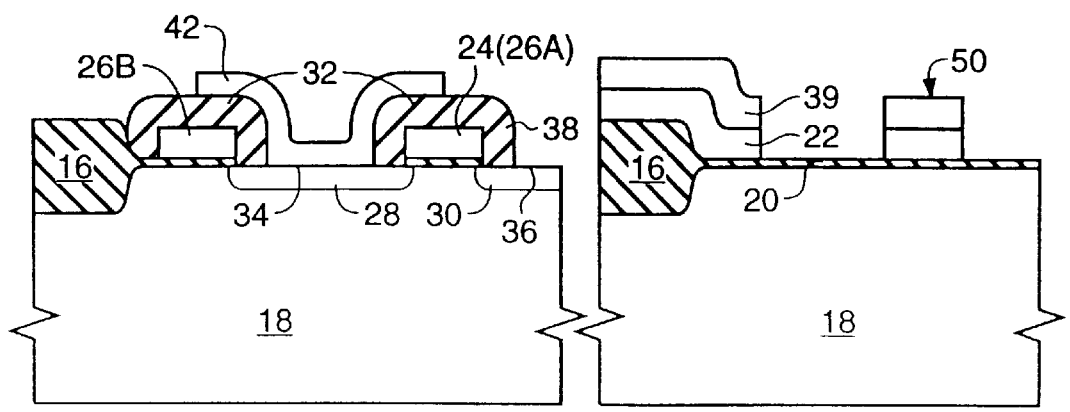

Referring to FIG. 6B, first polysilicon layer 22 is patterned and etched in the array to form gate 24 (wordline 26A) of access transistor 10 and wordline 26B. Impurities are then implanted in the surface of substrate 18 to form source and drain regions 28 and 30. Referring to FIG. 6C, second oxide layer 32 is stacked over substrate 18. Second oxide layer 32 is patterned and etched in the array to form buried contact region 34 at source/drain region 28, bitline contact 36 at source/drain region 30, and sidewalls 38 adjoining gate 24 and wordline 26B. As part of this etch, second oxide layer 32 is removed from the periphery. Referring to FIG. 6D, a second polysilicon layer 39 is stacked over substrate 18. Second polysilicon layer 39 is patterned and etched in the array to form bottom electrode 42 of capacitor 12. Polysilicon layers 39 and 22 are simultaneously etched in the periphery to form periphery p-channel transistor gate 50. Impurities are implanted in the surface of substrate 18 adjacent to periphery p-channel transistor gate 50 to form source and drain regions 52 and, thus, complete formation of periphery p-channel transistor 14. Bottom electrode 42 extends from above gate 24 to above wordline 26B passing along and in contact with source/drain region 28. Dielectric layer 44 is then formed over bottom electrode 42. Dielectric layer 44 is made of a thin nitride film, oxide-nitride-oxide (ONO) film or other suitable material. A third polysilicon layer 46 is then stacked over substrate 18 as shown in FIG. 6E.

Figure 6E:
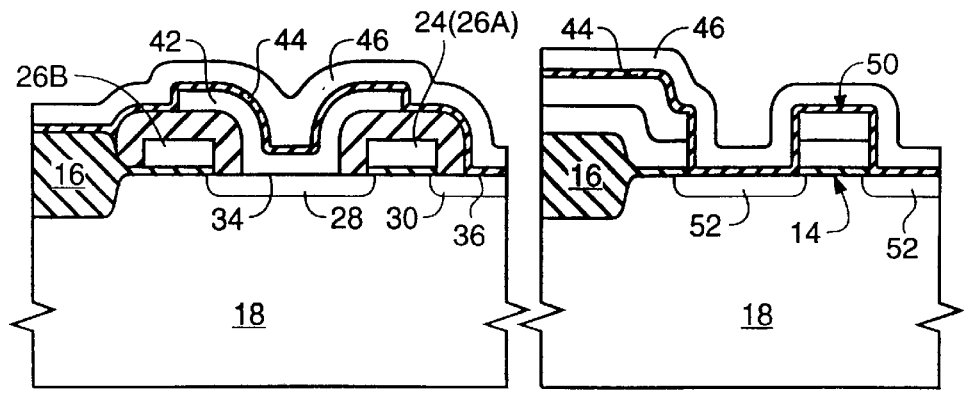
Figure 6F:
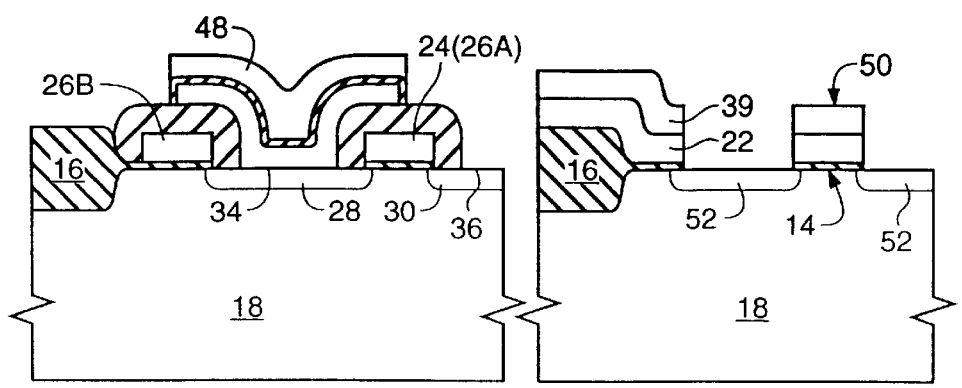

Referring to FIG. 6E, third polysilicon layer 46 is patterned and etched to form top electrode 48 in the array and to remove third polysilicon layer 46 and dielectric layer 44 from the periphery.

Referring again to FIG. 4, a thick layer 56 of borophosphorous silicate glass (BPSG) or other suitable insulator is formed over the exposed upper surfaces of the structure previously formed. Thick BPSG layer 56 is patterned and etched to form an opening for metal posts 58. Metal posts 58 and bitline 60 are formed using metal deposition techniques well-known in the art.

Various modifications to and applications of the preferred embodiments of the invention described above are possible. For instance, the invention is capable of use in the formation of other memory cell/peripheral circuit devices and structures, and modifications may be made to process steps and materials. Accordingly, the invention is limited only by the terms of the claims appended hereto.

I claim:

1. A method of forming a transistor in a peripheral circuit of a dynamic random access memory device (DRAM), comprising the steps of:

forming a first polysilicon layer over a substrate in an array region and in a peripheral region of the DRAM;

removing a portion of the first polysilicon layer in the array region to at least partially define a transistor gate in the array region;

after forming the transistor gate in the array region, forming a second polysilicon layer over the first polysilicon layer; and patterning the second polysilicon layer in the peripheral region and in the array region to form a periphery transistor gate in the peripheral region and a capacitor bottom electrode in the array region, the patterning performed through the use of a single mask step.

* * * * *